Dec. 23, 1952 W. E. BRADLEY Re. 23,598

HIGH-FREQUENCY TRANSMISSION SYSTEM

Original Filed Aug. 30, 1944 2 SHEETS—SHEET 1

INVENTOR.
WILLIAM E. BRADLEY
BY
Samuel Ostrolenk
ATTORNEY

HIGH-FREQUENCY TRANSMISSION SYSTEM

Original Filed Aug. 30, 1944 2 SHEETS—SHEET 2

INVENTOR.
WILLIAM E. BRADLEY
BY
Samuel Ostrolenk
ATTORNEY

Patented Dec. 23, 1952

Re. 23,598

UNITED STATES PATENT OFFICE 23,598

HIGH-FREQUENCY TRANSMISSION SYSTEM

William E. Bradley, New Hope, Pa., assignor, by mesne assignments, to Philco Corporation, Philadelphia, Pa., a corporation of Pennsylvania Original No. 2,485,031, dated October 18, 1949, Serial No. 552,176, August 31, 1944, which is a division of Serial No. 551,951, August 30, 1944. Application for reissue April 18, 1952, Serial No. 282,958

11 Claims. (Cl. 250—36)

Matter enclosed in heavy brackets [ ] appears in the original patent but forms no part of this reissue specification; matter printed in italics indicates the additions made by reissue.

This application, which is a division of application Serial No. 551,951, filed August 30, 1944, relates to a frequency stabilizing system and more particularly relates to a system for adjusting and stabilizing the frequency of high frequency oscillators as the voltage, current or load impedance varies.

In accordance with my invention, frequency stabilization is effected by reflecting a reactance into the line in response to a shift in frequency from normal of a kind that will tend to restore the frequency to its original value.

More specifically, in one form of my invention I connect a parallel reactance resonant to the frequency to be controlled across the transmission line. There are a number of points along the transmission line one half wave length apart, where an inductive reactance applied to the transmission circuit will elevate and a capacitative reactance will lower the frequency of the oscillator. At one of these points where this effect is maximum, I shunt my parallel resonant circuit across the transmission line which matches the impedance of the load.

If now the load impedance so changes that the frequency rises, a capacitance is presented by the parallel resonant circuit to the transmission line which lowers the frequency to its normal value.

If the load impedance so changes that the frequency falls, inductance is presented to the transmission line which raises the frequency to its normal value.

Halfway between the points along the transmission line, referred to above, an inductive reactance will lower and a capacitative reactance will elevate the frequency. This reactance is secured by a resonant series inductance and capacitance connected in series in the system at one of these half way points.

If the frequency rises in response to a change in load impedance above the stabilizing value and therefore above resonance frequency, an inductance is presented by the series resonant circuit to the transmission line which lowers the frequency to its normal value.

If the load impedance so changes that the frequency falls, capacitance is presented to the transmission line which raises the frequency to its normal value.

In the discussion above, I have referred to a special network. This, as will be clear from the description to follow, can also be a network in the coaxial sense, i. e., an arrangement of coaxial transmission line or it may be an arrangement of wave guide sections or resonant cavities. Arrangements can also be made using combinations of network elements, coaxial lines, wave guides and resonant cavities as will be explained hereinafter.

Accordingly, an object of my invention is to provide a novel network arrangement for effecting frequency stabilization of a system.

A further object of my invention is to provide a novel reactance network coupled to a circuit, the reactance reflected into the oscillating circuit being a function of the frequency fluctuations from normal to maintain the frequency of the system substantially constant.

Still another object of my invention is to provide a novel resonant parallel inductance capacitance circuit so connected in a transmission system that it presents capacitance to the line when the frequency rises to lower the frequency to normal and presents inductance to the line when the frequency drops to raise the frequency to normal.

Another object of my invention is to provide a novel resonant series inductance capacitance circuit so connected in a transmission system that it presents inductance to the line when the frequency rises to lower the frequency to normal and presents capacitance to the line when the frequency drops to raise the frequency to normal.

Still a further object of my invention is to provide a novel frequency controlled stabilizer which tends to maintain the load impedance substantially constant.

These and other objects of my invention will appear from a detailed discussion which follows in connection with the drawings, in which Figure 1 shows a method of connecting coaxial lines in parallel.

Figure 1:
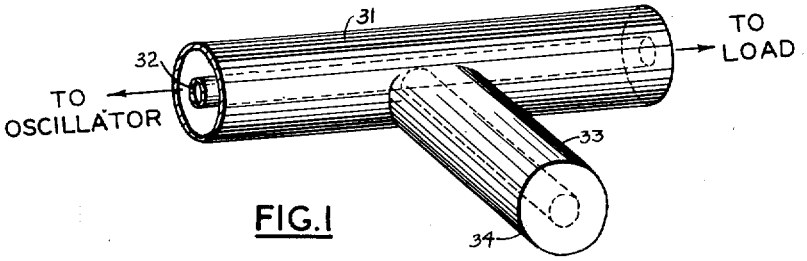

Referring now to the drawings, I have shown my invention applied to coaxial systems for micro-wave frequency transmissions. The coaxial line 31, 32 conducts power from the oscillator to the load. The oscillator such as a magnetron may have two or more modes of oscillations. At such a position on this line in relation to the oscillator that the addition of a capacitance lowers the frequency a maximum amount, a stub line 33, which is an odd number, of quarter waves long, is inserted at right angles to and in electrical parallel connection with the main line.

One end of stub line 33 is open and fits into an opening in the outer shield of coaxial line 31. The inner conductor of the stub extends through the junction of the stub and main coaxial line and is connected to the inner conductor of the main coaxial line. The opposite end of the stub is closed off at 34, so that it presents an infinite impedance to the main line 31, 32 at the normal frequency. If now the load is changed so that the frequency tends to decrease, this stub line operates as a less than quarter wave line, and thus operates to add inductance to the line and therefore to raise and restore the frequency to its normal value.

Because of its position on the line, its action counteracts the change in load impedance. Conversely, if the load impedance so changes that it acts as an inductance at the junction point of the main line and stub and the frequency rises, the stub line operates as a greater than quarter wave line and thus adds capacitance to the line causing the frequency to restore itself.

Figure 2:
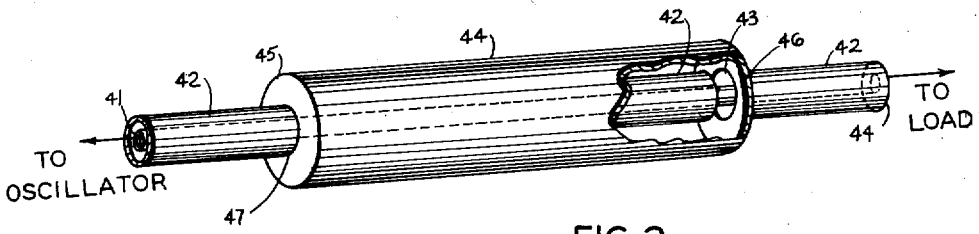
Figure 2 shows a method of connecting coaxial lines in series.

A coaxial series connection is shown in Figure 2. The central conductor 41 passes straight through the system. The outer conductor 42 of the main transmission line formed by 41 and 42 is broken at 43 at a point where a series inductance introduced into the transmission line decreases the frequency and a capacitance introduced into the line raises the frequency.

This break leads into a section of transmission line with the outer surface of 42 acting as the inner conductor and with a hollow cylindrical tube 44 acting as the outer conductor. The ends 45 and 46 of the tube are closed and in contact with conductor 42 along the circumferences 47 and 48 respectively.

The length of this section of 46 to 47 is chosen to be one half wave length or any other integral number of halves of a wave length of the frequency to be stabilized. This means that the impedance looking into this section of the line from the main transmission line is substantially a short circuit. Consequently, there results an effective short circuit at 43 when the stabilizing frequency exists.

At the frequency to be stabilized, the stabilizing unit does not have any effect upon a transmission through the main transmission line from the oscillator to the load.

If an impedance of the load is changed so that the impedance looking into the main section of the transmission line at position 43 appears to have a capacitance added to it, the frequency of the oscillator rises.

As the frequency begins to increase, the impedance looking into the compensator no longer appears as a short circuit; instead it appears to be an inductance. This inductance acts in series with the equivalent capacitance seen looking towards the load and consequently tends to neutralize this capacitance. The net result of this action is to tend to hold the oscillator frequency substantially at a predetermined value.

Correspondingly, and for reasons that now will be clear, when the frequency goes below the predetermined value, a corrective capacitance to increase the frequency is applied to the line.

Figure 3:
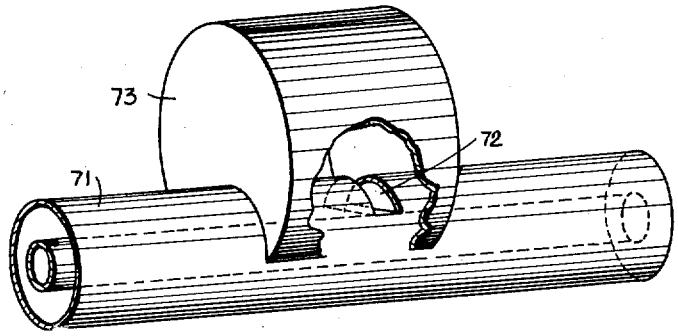
Figure 3 shows the invention applied to a resonant cavity with a coaxial line.

A combination of a resonant cavity with a coaxial line is shown in Figure 3. Here the main line 71 is broken by a slit 72 in the outer conductor. A cavity resonator 73 is fastened on the outside of this slit and serves the same function as the external line section in Figure 1. To accomplish this the cavity must be so dimensioned, in accordance with principles well known to the art, that it resonates in a mode such that it looks like a short circuit in series with the line at the resonant frequency.

While the embodiments shown in Figures 1 and 2 involve the principle of the invention, there are times when a more powerful stabilizing action is required. For this purpose the reactance change with frequency of the stabilizing network should be relatively great. This is obtained by having an exceedingly low L to C ratio in the tuned circuit.

It is inconvenient on straightforwardly constructed tuned circuits having the required L to C ratio, but over a narrow band its performance can readily be supplemented by means of other types of networks.

Figure 4:
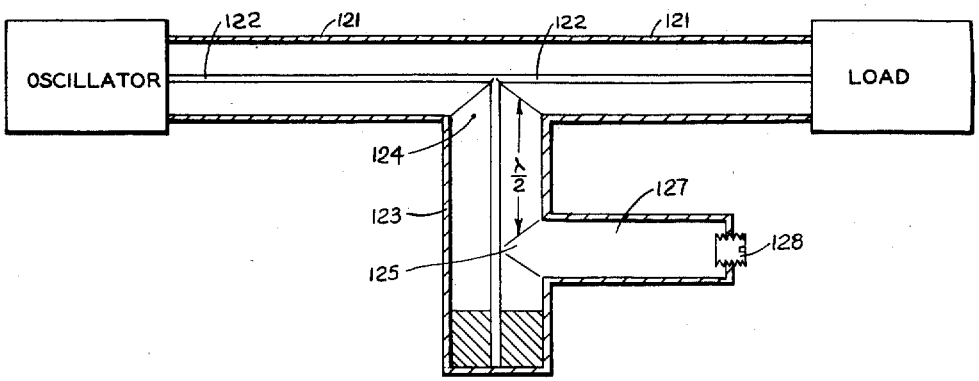
Figure 4 shows in cross-section a further specific construction of a coaxial line embodiment of my invention.

Another specific arrangement of my invention is described with reference to Figure 4. The main transmission line 121 and 122 is of the coaxial type, with an outer conductor 121 shown in section, and an inner conductor 122. A branch system is joined to the main coaxial line at a junction point 124 which is so chosen that an increase in the apparent inductance of the load as viewed from the junction point would cause the frequency to increase at a maximum rate. At the normal frequency, the impedance looking into the branch section at junction 124 is infinite.

In order for this to be true, the impedance at junction 125 which is the junction between a lossy section of line 126 and a cavity resonator 127, must be infinite because the length of line between junctions 124 and 125 is a half wave length. The impedance looking into the lossy section of line is primarily resistive, and is in series with the impedance looking into the cavity resonator from 125. This cavity resonator impedance is made infinite by adjustment of the tuning screw 128. Thus the impedance of the branch at junction point 124 is infinite.

At resonant frequency, the cavity looks like a very high impedance in series with the line. Since the cavity is a half wave from the main transmission line when it appears as a nearly open circuit, the stub looks substantially like an open circuit to the transmission line. When, however, the cavity looks like a relatively low impedance, i. e., when off resonant frequency, the low value of impedance is limited by series mismatching resistor *r*, which prevents the stub from ever short-circuiting the main transmission line.

When the frequency is slightly raised, the impedance of a cavity coupled in this manner becomes a capacitive reactance, as is well known in micro-wave theory, and so the impedance in parallel with the line at 124 becomes capacitive, which is what is required for the regulatory action described for Figure 1 to take place.

When the frequency is far from the cavity resonant frequency, the impedance of the cavity is low, so the net impedance at junctions 124 and 125 is the resistance of the lossy line. This prevents short-circuiting of the load at frequencies far away from resonance, and thus acts to prevent oscillator operation at a frequency of any other oscillation mode.

Figure 5:
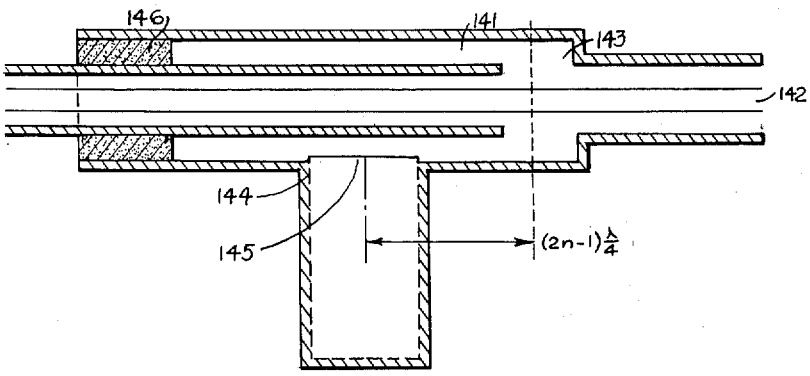
Figure 5 shows a further development of my invention utilizing the series coaxial line junction illustrated in Fig. 2.

Figure 5 is a coaxial line embodiment of a series connection and is noteworthy for its compactness. The cavity and resistive material are arranged in a manner electrically similar to the structure of Figure 4 except that the cavity is an odd number of quarter waves from the junction with the main line, which is of the type shown in Figure 2.

In Figure 5 the stub itself however is more complex than the one in Figure 2. The cavity resonator is coupled to the stub at a distance from the series junction 143 equal to an odd number of quarter wave lengths of the frequency to be stabilized. The cavity 144 is coupled to the stub line through a slot 145. The remaining part of the stub line is loaded at its end with some lossy material 146.

The cavity is coupled to the line section in physically the same but electrically a different way than the cavity 73 is coupled to line 71 in Figure 3. This electrical difference arises from the fact that now the cavity is resonating with the electrical lines parallel to the axis of the cavity.

The resonant cavity 73 is magnetically coupled to the transmission line 71. The electric coupling cancels out over the whole interior space and accordingly it acts as if it were coupled purely by inductance at the resonant frequency of the tuned circuits shown in Figure 6.

Figure 6:
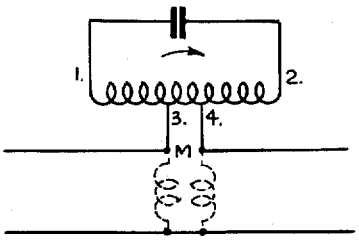
Figure 6 is the schematic equivalent of Figure 3.

A very high impedance limited only by losses in the circuit appears across the terminals 1 and 2 of Figure 6. At this same resonant frequency a very high impedance also appears across the terminals 3 and 4. However, it is only across a narrow band that the impedance across the terminals 3 and 4 is similar in form to that across 1 and 2. This impedance between terminals 3 and 4 differs in two particulars from that across 1 and 2. In the first place, it appears to be the impedance of a tuned circuit of vastly greater C to L ratio than the impedance between 1 and 2. The apparent C to L ratio depends on the proportion of inductance included between 3 and 4. The larger this inductance, the less the C to L ratio. On the other hand, it differs also in the particular that at some higher frequency the impedance between 3 and 4 goes to zero. This frequency is so far removed in the actual designs of cavities used as to be immaterial and the device is used only in the neighborhood of $W_0$ which is the resonant frequency of the tuned circuit.

In this mode of cavity resonance, the structure of Figure 3 therefore has the property that when the cavity 73 is in a resonant condition the coaxial line is completely open-circuited opposite the slot 72.

The result at the junction of 145 is that the cavity presents a high resonant impedance in series with the impedance of the rest of the stub which is a resistive impedance. At the frequency to be stabilized, the resonant impedance of the cavity is infinite, so the series resistance of the lossy stub is of no consequence.

The transformation action caused by the odd quarter wave length section of line makes the impedance of the stub at the series junction 143 appear as a short circuit at the frequency to be stabilized. If, however, the load of the main line is changed so that the change in load causes the impedance looking towards the load from junction 143 to become capacitive, the frequency of the oscillator will rise because the series junction 143 is so placed on the main transmission line that this will occur.

This rise in frequency causes the resonant impedance of the cavity to become less than infinite and to become capacitive. It is still high, however, and consequently the impedance corresponding to the increase in frequency causes the impedance at the junction 145 to become capacitive. At this junction, the series resistance of the lossy section of the stub is negligible. This impedance when transformed by the odd quarter wave section of transmission line appears as a low inductive reactance at the series junction 143. This inductive reactance then compensates for the capacitive reactance of the load as seen from the location 143. As a consequence, the frequency need change only by the amount necessary for this compensation to occur.

If now the oscillator should attempt to oscillate at a frequency far removed from the desired operating frequency, the impedance of the cavity would become low. This impedance in series with the impedance of the lossy section of the line presents substantially a resistive impedance to the end of the odd quarter wave length section of stub line. The transformation property of this odd quarter wave length section is such that there will appear at the series junction a resistive impedance looking into the stub. This impedance will be in series with the load impedance and consequently the oscillator will still be loaded. This will in effect prevent the oscillator from operating at an undesired mode.

If the lossy section of stub line had not been present, the impedance at series junction 143 under these circumstances are removed from the resonant frequency of the cavity; that is from the desired operating frequency would become an open circuit. This open circuit would effectively disconnect the load from the oscillator and might lead the oscillator to operate at a frequency far removed from the desired frequency. Not all oscillators, of course, have this difficulty, but magnetrons in particular do have a tendency to oscillate at a second frequency if they are unloaded at that frequency. The function of the lossy section will in that case prevent such undesirable oscillation frequencies.

Experimental work with frequency stabilizers of this type indicate that they are also effective in reducing the frequency change caused by variations in voltage or current in the oscillator tube. They find application in radar systems where reflected waves, such as may come from the antenna housing, effect an impedance change in the antenna load.

Various modifications of the principles of my invention will now be evident to those skilled in the art. I therefore prefer not to be bound by the specific disclosures hereinabove set forth, but only by the appended claims.

I claim:

1. In a coaxial cable transmission system for connecting a source of high frequency to a load whose impedance changes, a main coaxial cable having an opening in its outer shield, a branch coaxial cable having an open end and a lossy closed end, the outer shield of the branch being connected to the outer shield of the main coaxial cable at their respective openings, a cavity resonator connected to the outer shield of said branch coaxial cable at a second opening in the outer shield, said connection being a half wave length distance at the frequency to be stabilized from the connection of said branch to said main coaxial cable, said cavity resonator presenting infinite impedance at the frequency to be stabilized and the lossy end of said branch presenting resistance in series with the infinite impedance of said cavity resonator.

2. In a coaxial cable transmission system for connecting a source of high frequency to a load whose impedance changes, a main coaxial cable, a stub coaxial cable connected at one end thereof in series with said main coaxial cable and having a slit, and a cavity resonator coupled through said slit to said stub coaxial cable a distance from the series connection of said main and stub coaxial cable equal to an odd number of quarter wave lengths of the frequency to be stabilized, the other end of said stub coaxial cable carrying lossy material.

3. In a coaxial cable transmission circuit, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong where the addition of capacitance lowers the frequency of said source and a frequency stabilizer comprising a stub connected in parallel with said coaxial cable at a position along said cable where the addition of capacitance lowers the frequency of said source and a cavity resonator connected in series to said stub, having infinite impedance.

4. In a coaxial cable transmission circuit, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong where the addition of capacitance lowers the frequency of said source and a frequency stabilizer comprising a stub [and] *an* odd number of quarter waves long at the frequency to be controlled connected in parallel with said coaxial cable at a position along said cable where the addition of capacitance lowers the frequency of said oscillator, said stub in response to a drop in frequency being less than an odd number of quarters of the wave length, a cavity resonator connected to the outer shield of said stub at a second opening in the outer shield, said connection being a half wave length distance at the frequency to be stabilized from the connection of said stub to said main coaxial cable.

5. In a coaxial cable transmission circuit, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong where the addition of capacitance lowers the frequency of said source, and a frequency stabilizer comprising a stub an odd number of quarter waves long at the frequency to be controlled connected in parallel with said coaxial cable at a position along said cable where the addition of capacitance lowers the frequency of said oscillator, said stub in response to a rise in frequency being greater than an odd number of quarters of the wave length, a cavity resonator connected to the outer shield of said stub at a second opening in the outer shield, said connection being a half wave length distance at the frequency to be stabilized from the connection of said stub to said main coaxial cable.

6. In a coaxial cable transmission system, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong *spaced one-half wavelength apart* at which *the addition of inductance in shunt will raise, and* the addition of capacitance [raises] *in shunt will lower,* the frequency of said source, and a frequency stabilizer comprising a coaxial cable stub an odd number of quarter waves long at the frequency to be stabilized, one end of said stub being open and said main coaxial cable having a corresponding opening in its outer shield *at one of said first-named positions, the open end of* the outer shield of said stub being connected to the outer shield of said main coaxial cable at [the open end] *said opening in the outer shield of said main coaxial cable* and the inner concentric conductor of said stub extending through the open end of said stub and through the opening of the shield of said main coaxial cable and being connected to the inner conductor thereof, the opposite end of said stub being closed.

7. In a coaxial cable transmission circuit, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong at which the addition of capacitance raises the frequency of said source and a frequency stabilizer comprising a coaxial cable an integral number of half wave lengths at the frequency to be controlled connected in series with said coaxial cable at a position along said cable where the addition of capacitance raises the frequency of said source.

8. In a coaxial cable transmission circuit, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong at which the addition of capacitance raises the frequency of said source and a frequency stabilizer comprising a coaxial cable an integral number of half wave lengths at the frequency to be controlled connected in series with said coaxial cable at a position along said cable where the addition of capacitance raises the frequency of said oscillator, said stub in response to a drop in frequency presenting capacitance thereto to raise the frequency.

9. In coaxial cable transmission circuit, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong at which the addition of capacitance raises the frequency of said source and a frequency stabilizer comprising a coaxial cable an integral number of half wave lengths at the frequency to be controlled connected in series with said coaxial cable at a position along said cable where the addition of capacitance raises the frequency of said oscillator, said stub in response to a rise in frequency presenting inductance thereto to drop the frequency.

10. In a coaxial cable transmission system, a coaxial cable, a magnetron oscillator source having two or more modes of oscillations connected to one end of said coaxial cable, a load whose impedance changes connected to the other end of said coaxial cable, said coaxial cable connecting said load to said source of high frequency, said coaxial cable having positions therealong at which the addition of capacitance raises the frequency of said source, the outer shield of said cable being broken at a point where inductance introduced into the transmission line decreases the frequency and a capacitance introduced into the line raises the frequency, a hollow cylindrical tube closed at both ends, one end thereof being connected to the outer shield of said main coaxial cable, said tube extending over and enclosing said break in the main coaxial cable and connecting at its opposite end to the outer shield of said main coaxial cable, the portion of the outer shield of the main coaxial cable enclosed by said tube acting as the inner conductor and said cylinder acting as the outer shield of a coaxial cable, said cylinder being an integral number of halves of the wave length of the frequency to be stabilized.

11. In a coaxial cable transmission system, an oscillator whose frequency is subject to fluctuations in response to changes in load impedance, a load whose impedance changes, a main coaxial cable connecting said oscillator with said load, said cable, when energy is applied thereto from said oscillator, having points therealong one-half wavelength apart where an inductive reactance applied *in shunt* to said cable will elevate and a capacitive reactance applied *in shunt* to said cable will lower the frequency of said oscillator, and a stub *connected in shunt with said coaxial cable, said stub being* of [a] *such* predetermined length [with relation to the frequency connection to said coaxial cable for controlling the impedance of said line,] *as to provide an effective parallel resonant circuit at the frequency of said oscillator and* said stub connection being at one of said points to introduce frequency sensitive reactance as [these values] *the impedance* of the load changes to maintain a substantially constant frequency of said oscillator in said transmission system.

WILLIAM E. BRADLEY.

REFERENCES CITED

The following references are of record in the file of this patent or the original patent:

UNITED STATES PATENTS

| Number | Name | Date |
|---|---|---|
| 2,071,423 | Nordlohne | Feb. 23, 1937 |
| 2,088,461 | Briggs | July 27, 1937 |
| 2,199,045 | Dallenbach | Apr. 30, 1940 |
| 2,218,223 | Usselman et al. | Oct. 15, 1940 |
| 2,238,438 | Alford | Apr. 15, 1941 |
| 2,266,868 | Jakel | Dec. 23, 1941 |
| 2,321,521 | Salinger | June 8, 1943 |
| 2,373,233 | Dow et al. | Apr. 10, 1945 |